United States Patent
Barbee et al.

Patent Number: 5,134,963
Date of Patent: Aug. 4, 1992

[54] LPCVD REACTOR FOR HIGH EFFICIENCY, HIGH UNIFORMITY DEPOSITION

[75] Inventors: Steven G. Barbee, Dover Plains; Jonathan D. Chapple-Sokol, Poughkeepsie; Richard A. Conti, Mount Kisco; David E. Kotecki, Hopewell Junction, all of N.Y.

[73] Assignee: International Business Machines Corporation, Armonk, N.Y.

[21] Appl. No.: 784,160

[22] Filed: Oct. 28, 1991

[51] Int. Cl.$^5$ .............................................. C23C 16/00
[52] U.S. Cl. ...................................... 118/715; 118/725
[58] Field of Search .............................. 118/715, 725

[56] References Cited

U.S. PATENT DOCUMENTS

| | | | |
|---|---|---|---|
| 4,798,165 | 1/1989 | de Boer | 118/715 |
| 4,807,562 | 2/1989 | Sandya | 118/725 |
| 4,820,371 | 4/1989 | Rose | 118/50.1 |
| 4,825,809 | 5/1989 | Mieno | 118/715 |
| 4,909,914 | 3/1990 | Chiba et al. | 118/715 |
| 4,989,541 | 2/1991 | Mikoshiba et al. | 118/715 |
| 4,991,541 | 2/1991 | Sugata et al. | 118/716 |
| 4,993,358 | 2/1991 | Mahawili | 118/715 |

FOREIGN PATENT DOCUMENTS 3635647 5/1987 Fed. Rep. of Germany .

*Primary Examiner*—Richard Bueker
*Attorney, Agent, or Firm*—Whitham & Marhoefer

[57] ABSTRACT

An injector with a convex wall surface facing the susceptor directs vapor toward a wafer held by a susceptor producing a generally laminar flow across the surface of the wafer that in combination with the convex wall surface prevents formation of recirculation cells in the region between the wafer and the injector.

9 Claims, 2 Drawing Sheets

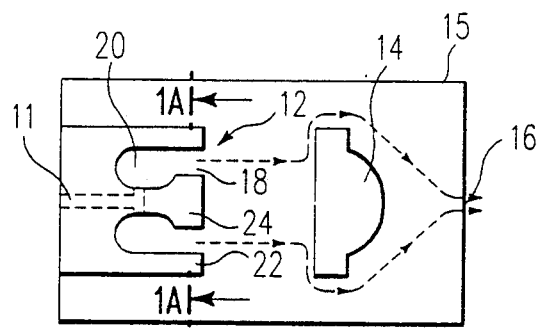
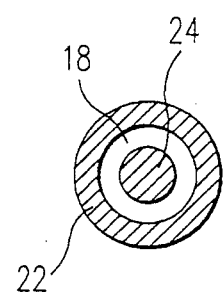
FIG. 1                FIG. 1A
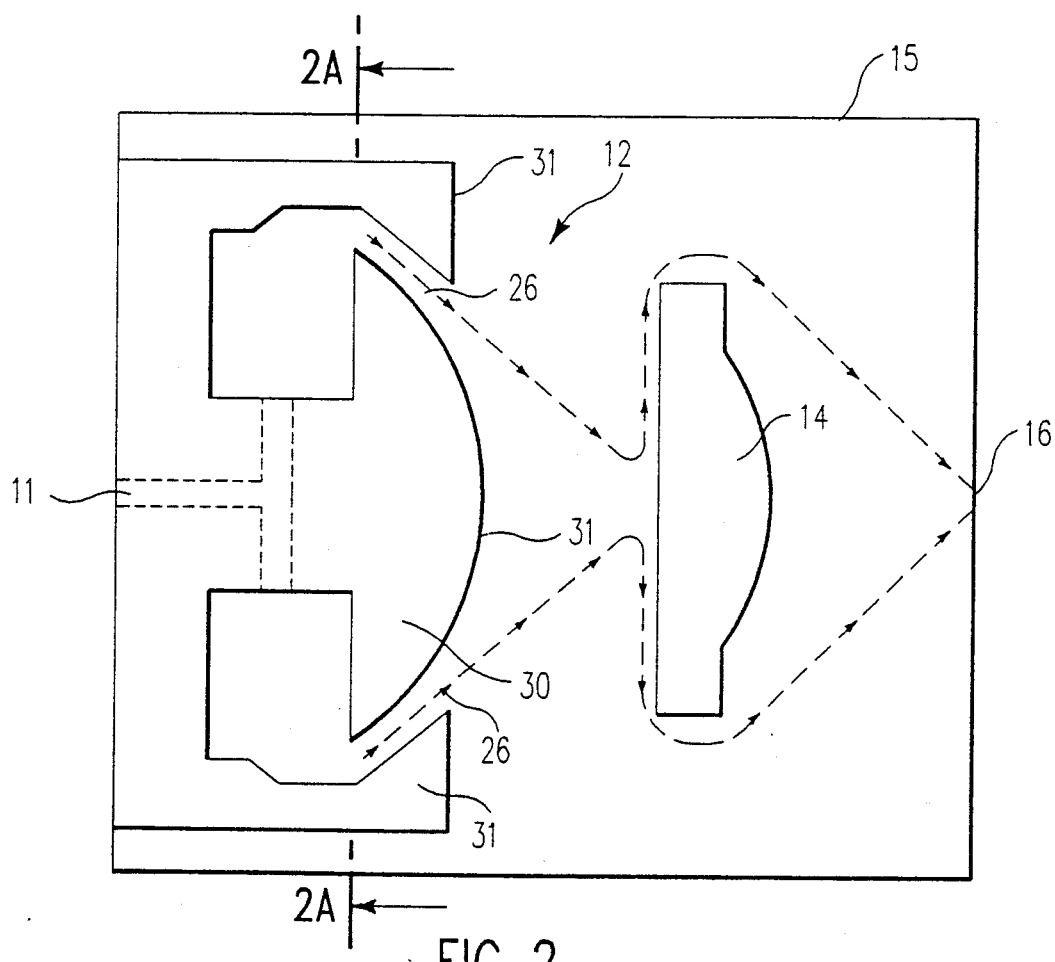
FIG. 2

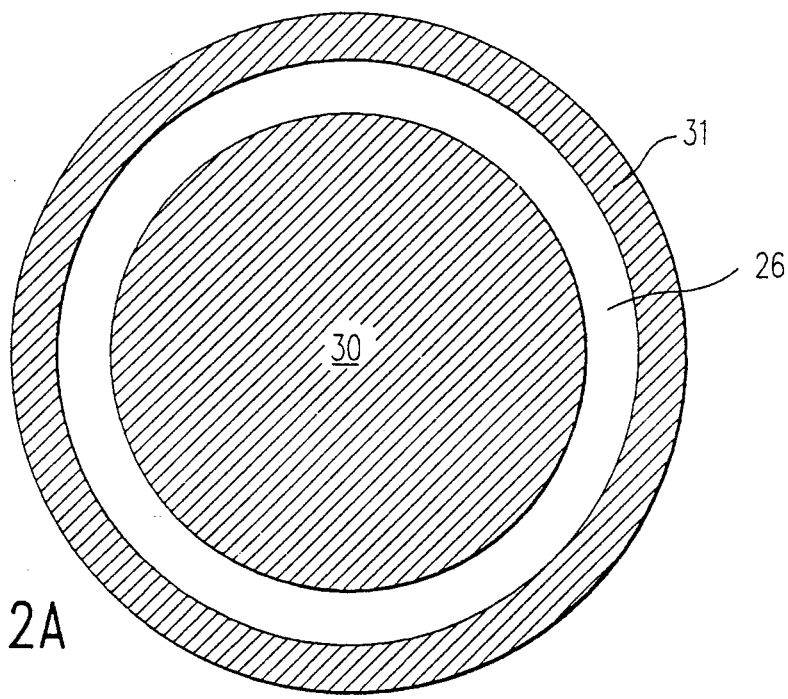
FIG. 2A
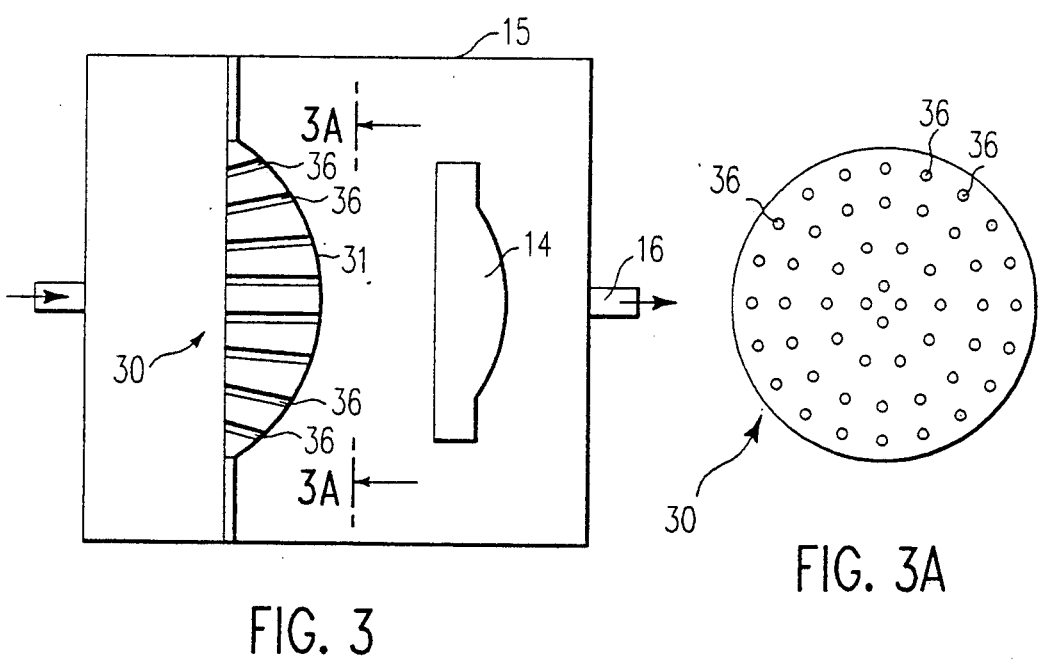
FIG. 3
FIG. 3A

LPCVD REACTOR FOR HIGH EFFICIENCY, HIGH UNIFORMITY DEPOSITION

BACKGROUND OF THE INVENTION

1. Field of the Invention

The present invention generally relates to an improved apparatus for chemical vapor deposition, and more particularly to an improved injector for use in such apparatus.

2. Description of the Prior Art

Chemical vapor deposition (CVD) and low pressure chemical vapor deposition (LPCVD) are well known and widely used processes for forming thin films in the semiconductor industry. FIGS. 1 and 1A illustrate one type of prior art apparatus for forming CVD and LPCVD films on semiconductor wafer surfaces, such films as aluminum oxide ($Al_2O_3$) or tungsten films for example. In this prior art apparatus, a single injector indicated by the general reference numeral 12 is located directly in front of a susceptor 14 and injects a vapor into a chamber 15. Undeposited vapor exists through a port 16 on the opposite side of the susceptor from the injector 12.

The injector 12 has a generally unrestricted angular passage 18 through which vapor flows from a plenum 20 into the chamber 15. A passage 11 connects the plenum to an external vapor supply. The passage 18 is formed between an outer ring 22 and a central cylindrical member 24 that has a flat surface 25 forming a wall in front of the susceptor 14. The outer edge of the passage 18 is coextensive with the outer periphery of the wafer held by the susceptor 14. The dashed arrows in the figure show generally the vapor flow path that applicants have determined exist for this prior art design, including recirculation cells.

The apparatus of the type illustrated in FIG. 1 can exhibit certain shortcomings: namely, poor film uniformity across the surface of a single wafer; possible particulate generation; low vapor reaction efficiency; and low film deposition rates.

Additional prior art reactors and their injectors are disclosed in the following U.S. patents.

U.S. Pat. No. 4,807,562, to Sandys, discloses a chemical vapor deposition (CVD) reactor including a vertically mounted multi-sided susceptor with means to adjust the gas flow across the width of each susceptor face.

U.S. Pat. No. 4,909,914, to Chiba et al., discloses a CVD reaction apparatus which comprises a flow control system provided with a convergent-divergent nozzle.

U.S. Pat. No. 4,989,541, to Mikoshiba et al., discloses a thin film forming apparatus including, in addition to a material gas nozzle, a control gas nozzle for jetting a control gas flow which encircles a material gas flow jetted from the material gas nozzle against a substrate supported in a reaction chamber, so as to shape the material gas flow into the form of a beam.

U.S. Pat. No. 4,993,358, to Mahawili, discloses a chemical vapor deposition (CVD) reactor and method wherein a chamber, preferably configured for receiving a single wafer as a deposition substrate, has multiple gas inlet orifices and exhaust ports which are independently adjustable for dynamically varying and controlling directionality of local gas flow vectors toward and past the deposition substrate.

SUMMARY OF THE INVENTION

An object of this invention is the provision of an improved injector for use with CVD and LPCVD systems of the type generally illustrated in FIG. 1; an injector that provides improved uniformity of deposited film across the surface of a single wafer. Further objects of the invention include the provision of an injector that provides improved reaction efficiency, faster film deposition rates and elimination of recirculation cell formation.

Briefly, this invention contemplates the provision of an injector with a convex wall surface facing the susceptor. The injector directs the vapor toward a wafer held by the susceptor at oblique angles with respect to the wafer surface, producing a generally laminar flow across the surface of the wafer that in combination with the convex wall surface prevents formation of recirculation cells in the region between the wafer and the injector. Such recirculation cells produce regions in the chamber where the residence time of the vapor in the reactor is longer than average, leading to non-uniform film thickness and particulate generation.

BRIEF DESCRIPTION OF THE DRAWINGS

The foregoing and other objects, aspects and advantages will be better understood from the following detailed description of a preferred embodiment of the invention with reference to the drawings, where like reference numerals are used to identify like parts in the various views and in which:

FIG. 1 is a schematic view, with parts in section, of prior art CVD and LPCVD apparatus. FIG. 1A is a sectional view along the line A—A of FIG. 1.

FIG. 2 is a view similar to FIG. 1 showing an injector in accordance with the teachings of this invention. FIG. 2A is a schematic sectional view along the line A—A of FIG. 2.

FIG. 3 is a schematic view of another embodiment of the invention and FIG. 3A is a view of the injector as viewed head-on from the susceptor.

DETAILED DESCRIPTION OF A PREFERRED EMBODIMENT OF THE INVENTION

Referring now to FIG. 2 and FIG. 2A, in accordance with the teachings of this invention the injector 12 has a passageway 26 which directs the vapor at an oblique angle with respect to the susceptor 14. The angle of incidence at which the passage directs the vapor toward the surface of the susceptor is preferably in a range between 20° and 70°. The passageway 26 restricts vapor flow relative to the prior art design, thereby increasing the flow velocity, although for most applications the flow parameters are such that the flow remains subsonic. A central generally mushroom shaped member 30 in combination with an outer ring 31 forms an annular passage 26 that directs flow toward the center of the wafer. Member 30 has a convex, spherical surface 31 facing the susceptor 14 with the projection of surface 31 onto the susceptor approximately and co-extensive with the circumference of a wafer upon which a film is to be deposited. This convex surface eliminates vapor recirculation cells in the chamber in front of the wafer, thereby preventing a buildup of particles in front of the injector and providing uniform residence time of vapor in the wafer surface area with a resultant film uniformity. The dotted arrows indicate the dominant vapor flow path.

FIG. 3 and FIG. 3A illustrate an alternate embodiment of the invention. Here, the convex surface 31 has a plurality of passages 36 through it for directing vapor toward the susceptor 14. In the embodiment shown in the drawing, some of the passages 36 direct vapor in a direction normal to the surface of a wafer held by the susceptor and other passages 36 direct vapor in a direction oblique to the wafer surface. Alternative arrangements are possible. All of the passages 36 may direct vapor in a direction normal to the wafer surface or all of the passages may direct the vapor obliquely with respect to the wafer surface. As best seen in FIG. 3A, in this particular embodiment the passages are arranged in concentric circles, although other patterns may be used if desired.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A chemical vapor deposition reactor comprising in combination:
    an injector disposed in a chamber opposite a susceptor upon which a wafer is supported during chemical deposition of film from a vapor injected into said chamber from said injector, said injector having convex surface facing said susceptor;
    said injector having an orifice directing vapor toward said wafer at an oblique angle with respect to the surface of said wafer.

2. A chemical vapor deposition reactor as in claim 1, wherein said convex surface is spherical and the projection of said convex surface on said susceptor is substantially co-extensive with the periphery of said wafer.

3. A chemical vapor deposition reactor as in claim 1, wherein said orifice is an annular ring substantially coincident in extent with the peripheral edge of said wafer.

4. A chemical vapor deposition reactor as in claim 2, wherein said orifice is an annular ring substantially coincident in extent with the peripheral edge of said wafer.

5. A chemical vapor deposition reactor as in claim 1, wherein said orifice includes a plurality of passages disposed in a pattern on said convex surface.

6. A chemical vapor deposition reactor as in claim 2, wherein said orifice includes a plurality of passages disposed in a pattern on said convex surface.

7. A chemical vapor deposition reactor as in claim 5, wherein said pattern is a plurality of concentric rings.

8. A chemical vapor deposition reactor as in claim 1, wherein said oblique angle is in a range between 20 degrees and 70 degrees.

9. A chemical vapor deposition reactor as in claim 2, wherein said oblique angle is in a range between 20 degrees and 70 degrees.

* * * * *